United States Patent
Monk et al.

(10) Patent No.: US 11,095,295 B2
(45) Date of Patent: Aug. 17, 2021

(54) SPUR CANCELLATION FOR SPUR MEASUREMENT

(71) Applicant: Silicon Laboratories Inc., Austin, TX (US)

(72) Inventors: Timothy A. Monk, Hudson, NH (US); Rajesh Thirugnanam, Nashua, NH (US)

( * ) Notice: Subject to any disclaimer, the term of this patent is extended or adjusted under 35 U.S.C. 154(b) by 0 days.

(21) Appl. No.: 16/018,598

(22) Filed: Jun. 26, 2018

(65) Prior Publication Data

US 2019/0393881 A1 Dec. 26, 2019

(51) Int. Cl.
 H03L 7/093 (2006.01)
 G01R 29/26 (2006.01)
 G04F 10/00 (2006.01)
 G01R 31/317 (2006.01)

(52) U.S. Cl.
 CPC .............. *H03L 7/093* (2013.01); *G01R 29/26* (2013.01); *G01R 31/31727* (2013.01); *G04F 10/005* (2013.01)

(58) Field of Classification Search
 CPC ... H03L 7/093; G01R 29/26; G01R 31/31727; G04F 10/005
 See application file for complete search history.

(56) References Cited

U.S. PATENT DOCUMENTS

| 3,508,195 A | 4/1970 | Sellers |
| 4,301,466 A | 11/1981 | Lemoine et al. |
| 5,467,373 A | 11/1995 | Ketterling |
| 5,576,666 A | 11/1996 | Rauvola |
| 6,515,525 B2 | 2/2003 | Hasegawa |
| 6,829,318 B2 | 12/2004 | Kawahara |
| 7,061,276 B2 | 6/2006 | Xu |
| 7,064,616 B2 | 6/2006 | Reichert |
| 7,208,990 B1 | 4/2007 | Hassun |
| 7,391,839 B2 | 6/2008 | Thompson |
| 7,545,190 B2 | 6/2009 | Chiang et al. |
| 7,605,662 B2 | 10/2009 | Kobayashi et al. |
| 7,746,972 B1 | 6/2010 | Melanson et al. |
| 7,888,973 B1 | 2/2011 | Rezzi |

(Continued)

OTHER PUBLICATIONS

Gupta, M. and Song, B.S., "A 1.8GHz Spur Cancelled Fractional-N Frequency Synthesizer with LMS Based DAC Gain Calibration," IEEE International Solid-State Circuits Conference, vol. 41, No. 12, Dec. 2006, pp. 2842-2851.

(Continued)

*Primary Examiner* — Patrick C Chen
(74) *Attorney, Agent, or Firm* — Zagorin Cave LLP

(57) ABSTRACT

A spur measurement system uses a first device with a spur cancellation circuit that cancel spurs responsive to a frequency control word identifying a spurious tone of interest. A device under test generates a clock signal and supplies the clock signal to the first device through an optional divider. The spur cancellation circuit in the first device generates sine and cosine weights at the spurious tone of interest as part of the spur cancellation process. A first magnitude of the spurious tone in a phase-locked loop in the first device is determined according to the sine and cosine weights and a second magnitude of the spurious tone in the clock signal is determined by the first magnitude divided by gains associated with the first device.

16 Claims, 6 Drawing Sheets

(56) References Cited

U.S. PATENT DOCUMENTS

| | | | |
|---|---|---|---|
| 8,207,766 | B2 | 6/2012 | Yu |
| 8,390,348 | B2 | 3/2013 | Burcea |
| 8,427,243 | B2 | 4/2013 | Chen et al. |
| 8,497,716 | B2 | 7/2013 | Zhang |
| 8,604,840 | B2 | 12/2013 | Ahmadi et al. |
| 8,947,139 | B1 | 2/2015 | Vercesi et al. |
| 8,957,712 | B2 | 2/2015 | Tang et al. |
| 9,065,457 | B2 | 6/2015 | Namdar-Mehdiabadi |
| 9,071,195 | B2 | 6/2015 | Gabbay |
| 9,207,646 | B2 * | 12/2015 | Wang ............... G04F 10/005 |
| 9,246,500 | B2 | 1/2016 | Perrott |
| 9,490,818 | B2 | 11/2016 | Perrott |
| 9,634,678 | B1 | 4/2017 | Caffee et al. |
| 9,762,250 | B2 | 9/2017 | Perrott |
| 9,923,563 | B1 | 3/2018 | Horovitz et al. |
| 10,581,418 | B2 | 3/2020 | Wu et al. |
| 10,594,329 | B1 | 3/2020 | Elkholy |
| 10,840,897 | B1 | 11/2020 | Rafi |
| 2002/0097826 | A1 | 7/2002 | Iwata et al. |
| 2007/0090866 | A1 | 4/2007 | Park et al. |
| 2008/0061850 | A1 | 3/2008 | Watanabe |
| 2008/0116946 | A1 | 5/2008 | Masson |
| 2008/0129352 | A1 | 6/2008 | Zhang |
| 2008/0218228 | A1 | 9/2008 | Masson |
| 2009/0132884 | A1 | 5/2009 | Suda et al. |
| 2009/0251225 | A1 | 10/2009 | Chen et al. |
| 2010/0061499 | A1 | 3/2010 | Mijuskovik |
| 2010/0097150 | A1 | 4/2010 | Ueda et al. |
| 2010/0213984 | A1 | 8/2010 | Shin et al. |
| 2010/0264963 | A1 | 10/2010 | Kikuchi et al. |
| 2011/0025388 | A1 | 2/2011 | Lamanna |
| 2011/0074479 | A1 | 3/2011 | Yun et al. |
| 2011/0109354 | A1 | 5/2011 | Feng et al. |
| 2011/0109356 | A1 | 5/2011 | Ali et al. |
| 2011/0133799 | A1 | 6/2011 | Dunworth et al. |
| 2011/0204938 | A1 | 8/2011 | Lamanna |
| 2011/0204948 | A1 | 8/2011 | Satoh et al. |
| 2011/0234272 | A1 | 9/2011 | Yun |
| 2012/0153999 | A1 | 6/2012 | Kim |
| 2012/0161832 | A1 | 6/2012 | Lee et al. |
| 2013/0050013 | A1 | 2/2013 | Kobayashi et al. |
| 2013/0112472 | A1 * | 5/2013 | Welland ............... H03L 7/18 174/350 |
| 2013/0222026 | A1 | 8/2013 | Havens |
| 2013/0257494 | A1 | 10/2013 | Nikaeen et al. |
| 2014/0077849 | A1 | 3/2014 | Chen et al. |
| 2014/0211899 | A1 * | 7/2014 | Furudate ............... H04B 1/00 375/376 |
| 2014/0266341 | A1 | 9/2014 | Jang et al. |
| 2014/0268936 | A1 | 9/2014 | Lu |
| 2015/0008961 | A1 | 1/2015 | Kim et al. |
| 2015/0145567 | A1 * | 5/2015 | Perrott ............... H03L 7/093 327/156 |
| 2015/0145571 | A1 | 5/2015 | Perrott |
| 2015/0207514 | A1 | 7/2015 | Kim et al. |
| 2016/0112053 | A1 | 4/2016 | Perrott |
| 2016/0359493 | A1 | 12/2016 | Chen et al. |
| 2019/0068205 | A1 | 2/2019 | Tamura et al. |

OTHER PUBLICATIONS

Hedayati, H. et al., "A 1 MHz Bandwidth, 6 GHz 0.18 μm CMOS Type-I ΔΣ Fractional-N Synthesizer for WiMAX Applications," IEEE Journal of Solid State Circuits, vol. 44, No. 12, Dec. 2009, pp. 3244-3252.

Hedayati, H. and Bakkaloslu, B., "A 3GHz Wideband ΣΔ Fractional-N Synthesizer with Voltage-Mode Exponential CP-PFD", IEEE Radio Frequency Integrated Circuits Symposium, 2009, pp. 325-328.

Hsu, C.M. et al., "A Low-Noise Wide-BW 3.6-GHz Digital ΔΣ Fractional-N Frequency Synthesizer with a Noise-Shaping Time-to-Digital Converter and quantization Noise Cancellation," IEEE Journal of Solid-State Circuits, vol. 43, No. 12, Dec. 2008, pp. 2776-2786.

Menninger, S. and Perrott, M., "A 1—MHz Bandwidth 3.6-GHz 0.18μm CMOS Fractional-N Synthesizer Utilizing a Hybrid PFD/DAC Structure for Reduced Broadband Phase Noise," IEEE Journal of Solid-State Circuits, vol. 41, No. 4, Apr. 2006, pp. 966-980.

Pamarti et al., "A wideband 2.4GHz Delta-Sigma Fractional-N PLL with 1 Mb/s In-Loop Modulation," IEEE Journal of Solid-State Circuits, vol. 39, No. 1, Jan. 2004, pp. 49-62.

Staszewski, R.B. et al., "All-Digital PLL and Transmitter for Mobile Phones," IEEE Journal of Solid-State Circuits, vol. 40, No. 12, Dec. 2005, pp. 2469-2482.

Staszewski, R.B. et al., "1.3 V, 20 ps Time-to-Digital Converter for Frequency Synthesis in 90-nm CMOS," IEEE Transactions on Circuits and Systems-II, Express Briefs, vol. 53, No. 3, Mar. 2006, pp. 220-224.

Straayer, M.Z. and Perrott, M.H., A 12-Bit, 10-MHz Bandwidth, Continuous-Time ΣΔ ADC With a 5-Bit, 950-MS/s VCO-Based Quantizer, IEEE Journal of Solid-State Circuits, vol. 43, No. 4, Apr. 2008, pp. 805-814.

Swaminathan et al., "A Wide-Bandwidth 2.4 GHz ISM Band Fractional-N PLL with Adaptive Phase Noise Cancellation", IEEE Journal of Solid-State Circuits, vol. 42, No. 12, Dec. 2007, pp. 2639-2650.

Temporiti, E. et al., "A 700kHz Bandwith ΣΔ Fractional Synthesizer with Spurs Compensation and Linearization Techniques for WCDMA Applications," IEEE Journal of Solid-State Circuits, vol. 39, No. 9, Sep. 2004, pp. 1446-1454.

Li, Y., et al., "On-Chip Spur and Phase Noise Cancellation Techniques," IEEE Asian Solid-State Circuits Conference, Nov. 6-8, 2017, pp. 109-112.

U.S. Appl. No. 16/593,473, entitled "Spur Cancellation in a PLL System with an Automatically Updated Target Spur Frequency," filed Oct. 4, 2019, by Timothy A. Monk and Douglas F. Pastorello.

U.S. Appl. No. 16/143,717, entitled "Spur Cancellation with Adaptive Frequency Tracking," filed Sep. 27, 2018, by Timothy A. Monk and Rajesh Thirugnanam.

U.S. Appl. No. 16/143,711, entitled "Spur Canceller with Multiplier-Less Correlator," filed Sep. 27, 2018, by Timothy A. Monk and Rajesh Thirugnanam.

Avivi, R., et al., "Adaptive Spur Cancellation Technique in All-Digital Phase-Locked Loops," IEEE Transactions on Circuits and Systems—II: Express Briefs, vol. 64, No. 11, Nov. 2017, pp. 1292-1296.

Ho, C. and Chen, S., "A Fractional-N DPLL With Calibration-Free Multi-Phase Injection-Locked TDC and Adaptive Single-Tone Spur Cancellation Scheme," IEEE Transactions on Circuits and Systems-K: Regular Papers, vol. 63, No. 8, Aug. 2016, pp. 1111-1122.

IDT, "I2C Programmable Ethernet Clock Generator," 8T49N4811 Data Sheet, Revision A, Mar. 30, 2015, pp. 1-34.

Inti, R. et al., "A 0.5-to-2.5 Gb/s Reference-Less Half-Rate Digital CDR with Unlimited Frequency Acquisition Range and Improved Input Duty-Cycle Error Tolerance," IEEE Journal of Solid-State Circuits, vol. 46, No. 12, Dec. 2011, pp. 3150-3162.

Ma, S., "Feasibility Study of Frequency Doubling Using an AN XOR-Gate Method," MSc. Thesis, Jan. 2013, pp. 1-77.

Oortgiesen, R., "Feasibility Study of Frequency Doubling Using a Dual-Edge Method," MSc. Thesis, Nov. 2010, pp. 1-56.

Razavi, B., "RF Microelectronics," Second Editioin, Prentice Hall, 2012, pp. 664-667.

U.S. Appl. No. 16/805,336, entitled "Spur and Quantization Noise Cancellation for PLLS with Non-Linear Phase Detection," filed Feb. 28, 2020, by Aslamali A. Rafi et al.

Wikipedia, "Phase-Locked Loop," https://en.wikipedia.org/wiki/Phase-locked_loop, downloaded Dec. 14, 2015, 17 pages.

* cited by examiner

SPUR CANCELLATION FOR SPUR MEASUREMENT

BACKGROUND

Field of the Invention

This application relates to measurement of spurious tones.

Description of the Related Art

Signals generated by phase-locked loops and other timing circuits can include undesirable spurious tones. Accurately identifying the existence of spurious tones in a testing environment can help ensure that the parts being supplied do not generate significant spurious tones at frequencies of interest. Accordingly, improved measurement techniques for spurious tones are desirable.

SUMMARY OF EMBODIMENTS OF THE INVENTION

A first device is supplied with a first frequency control word identifying a first frequency corresponding to a spurious tone of interest to be measured in a first signal generated by a device under test. A phase-locked loop (PLL) of the first device generates a second signal based on the first signal. Presence of the spurious tone in the second signal is determined using a spur cancellation circuit in the first device.

In another embodiment a spur measurement system includes a first device having a spur cancellation circuit responsive to a frequency control word identifying a spurious tone of interest to be measured in a first signal received by the first device. The spur cancellation circuit is configured to cancel the spurious tone in a second signal in the first device, the second signal based on the first signal. A storage location in the first device stores information generated in the spur cancellation circuit and used to cancel the spurious tone. A first magnitude of the spurious tone in the second signal is determined according to the information and a second magnitude of the spurious tone in the first signal is determined by the first magnitude divided by gains associated with the first device.

In another embodiment a method includes supplying a first device with a frequency control word identifying a frequency corresponding to a spurious tone of interest to be measured in a first signal. The method further includes generating the first signal in a device under test and generating a second signal in a phase-locked loop of the first device, the second signal based in part on the first signal. Presence of the spurious tone in the first signal is determined based on a spur cancellation circuit in the first device canceling the spurious tone in the second signal. A first magnitude of the spurious tone is determined in the second signal and a second magnitude of the spurious tone in the first signal is determined based on the first magnitude divided by gains associated with the first device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments described herein relate to a spur, or tone, cancellation system or circuit such as one incorporated in a high-performance fractional-N highly-digital phase-locked loop (PLL). One such PLL is described in U.S. Pat. No. 9,762,250, entitled "Cancellation of Spurious Tones Within A Phase-Locked Loop With A Time-To-Digital Converter", filed Jul. 31, 2014, naming Michael H. Perrott as inventor, which application is incorporated herein by reference. The spurious tone cancellation system in one device can be used to detect spurious tones in other devices in a lab or production test environment.

Figure 1:
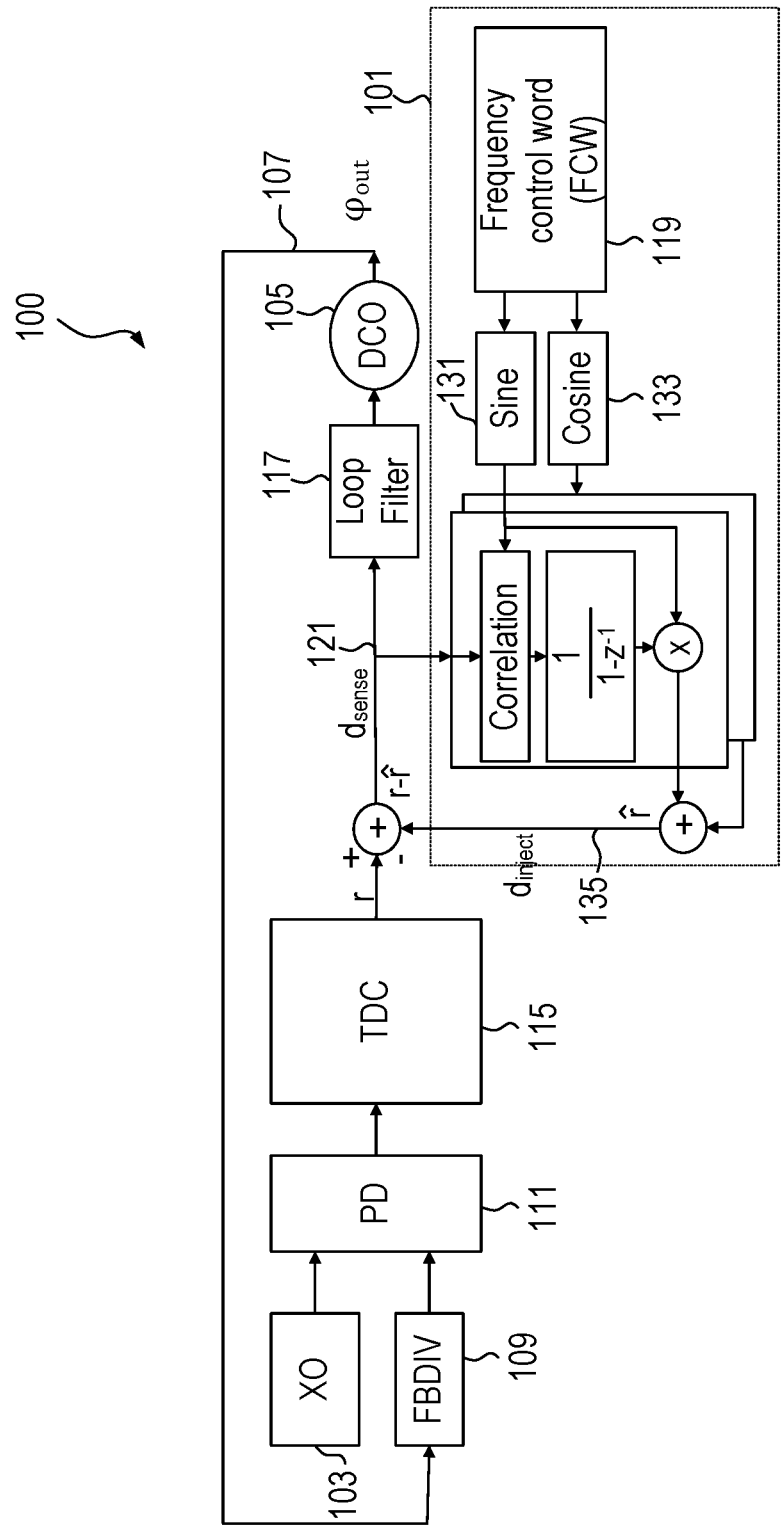
FIG. 1 illustrates a high level block diagram of a PLL with a spur cancellation circuit.

FIG. 1 illustrates a high level block diagram of an embodiment of a PLL 100 with a spur cancellation circuit 101. The PLL 100 receives a reference clock signal from crystal oscillator (XO) 103. A digitally controlled oscillator (DCO) 105 supplies an output signal 107, which is fed back through feedback divider 109 to the phase detector 111. The phase detector supplies a time to digital converter circuit 115, which supplies a signal r that has a spurious tone (spur) canceled before being supplied to loop filter 117.

The spur cancellation circuit receives a programmable frequency control word (FCW) 119 that identifies the spur of interest to be cancelled. In the spur cancellation circuit 101, sine and cosine terms 131 and 133 at the programmable frequency are correlated against a sense node, $d_{sense}$, 121 inside the PLL. The resulting error signals drive a pair of accumulators, which set the weights on the sine and cosine signals, producing a spur cancellation signal, $d_{inject}$ 135. Negative feedback drives the amplitude and phase of the cancellation signal to be such that no spur appears (or the spur is significantly reduced) in the PLL output signal 107.

Figure 2:
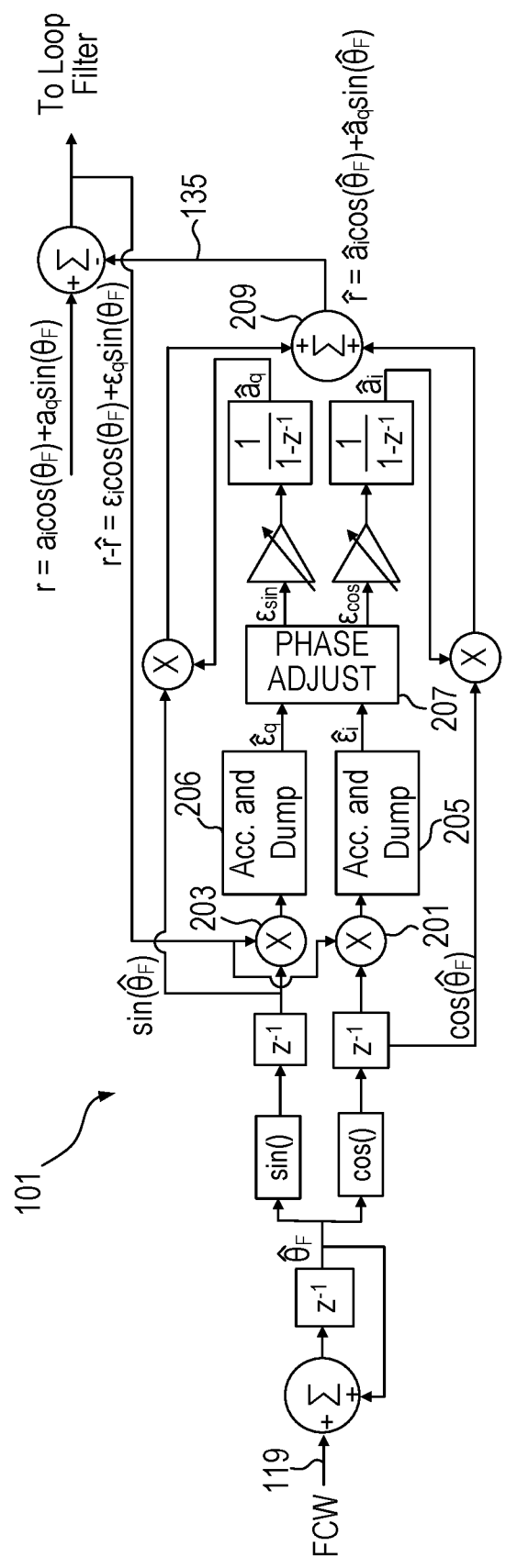
FIG. 2 illustrates additional details of an embodiment of a spur cancellation circuit.

FIG. 2 illustrates an embodiment of the spur cancellation circuit 101 in more detail. In the embodiment of FIG. 2, the two correlators are each implemented with a high-resolution multiplier 201 and 203 and accumulate-and-dump circuits 205 and 206. A phase adjust block 207 follows the accumulate and dump circuits to compensate for PLL dynamics. The final weights on the sine and cosine terms are $\hat{a}_q$ and $\hat{a}_i$, which are the scale factors for the sine and cosine components of the cancellation signal. The weights multiply the sine and cosine terms (sin $\hat{\theta}_F$ and cos $\hat{\theta}_F$) and summer 209 sums together the multiplication results and supplies as the spur cancellation signal $d_{inject}$ ($\hat{r}$ in FIG. 2) to cancel the spurious tone at the frequency specified by FCW.

Figure 3:
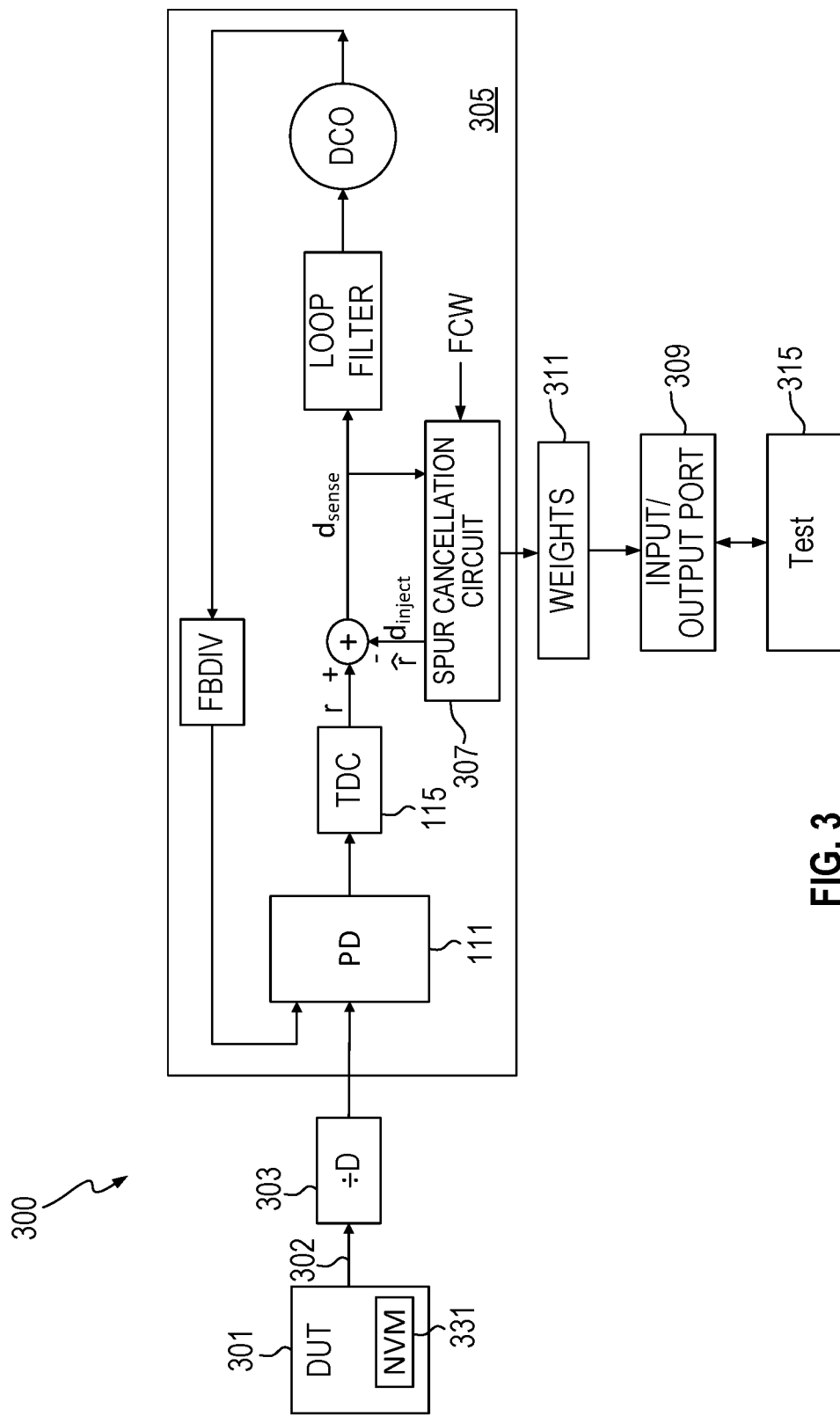
FIG. 3 illustrates an embodiment of a spur measurement system that uses a PLL with a spur cancellation circuit.

While the spur cancellation circuit shown in FIGS. 1 and 2 can be used to cancel spurs in a clock generation system, the spur cancellation circuits can also be used as part of a spur measurement system and used, e.g., in a production test environment. FIG. 3 illustrates an embodiment of a spur measurement system 300 to measure spurs in a signal generated by a device under test (DUT) 301. DUT 301 generates an output clock signal 302 that goes through an optional divider 303, which divides the output frequency by D to be within the valid reference frequency of the PLL 305. PLL 305 incorporates a spur cancellation circuit 307. The spur cancellation circuit operates in sequence targeting a list of possible spur frequencies supplied as FCWs. The list of possible spur frequencies can be provided over input/output port 309 from a test apparatus 315. The input/output port 309 may be implemented, e.g., as a serial interface. The spur frequencies specified in the FCWs can also be scanned in if a scan interface is available.

For each spur frequency of interest, the spur cancellation circuit generates sine and cosine weights. If there is no spur at the frequency of interest, the sine and cosine weights reflect the lack of a spur present at the frequency of interest by being approximately 0. If there is a spur at the frequency of interest, the existence of the spur will be confirmed based on the magnitude of the spur on the internal PLL signal r supplied by TDC 115. The spur sine and cosine weights associated with each FCW may be stored in storage 311. The storage 311 may be in locations separate from the spur cancellation circuit 307 or storage such as registers, flip-flops, or latches within the spur cancellation circuit 307. The spur amplitudes can be computed conventionally by taking the sine and cosine weights kept in storage 311 and converting the sine and cosine weights to the corresponding magnitude and phase representation. The conversion to magnitude and phase may be accomplished using $(x^2+y^2)^{1/2}$ and $\tan^{-1}(y/x)$, where x is $â_i$ and y is $â_q$. Other embodiments can calculate the spur magnitude and phase in different ways depending on the specific implementation of the spur cancellation circuit. The magnitude and phase calculation can be done either on the integrated circuit with the PLL 305, e.g., if a microcontroller is available on chip, or off chip by accessing the weights storage 311 through the input/output port 309 and computing the amplitude in the test apparatus 315. In an embodiment, the spur on the DUT clock signal 302 can be determined based on the spur magnitude (determined using the sine and cosine weights) on the internal PLL signal r divided by the gains of the phase detector 111 and TDC 115 in the PLL. The gains associated with phase detector 111 and TDC 115 can be measured empirically or through simulation.

Figure 4:
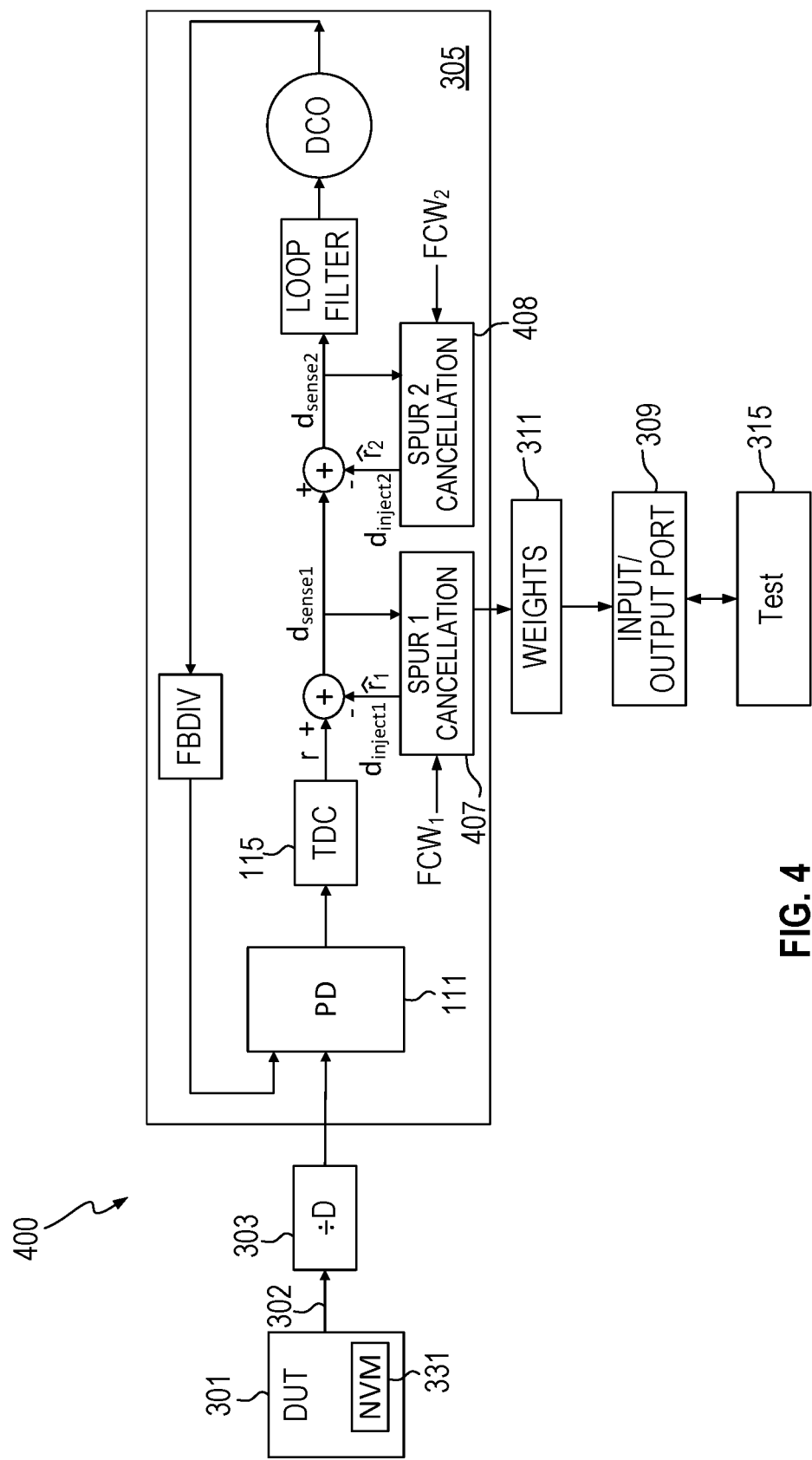
FIG. 4 illustrates an embodiment of a spur measurement system that uses a PLL with multiple spur cancellation circuits.

Referring to FIG. 4, the speed of spur measurement can be improved by using multiple spur cancellation circuits 407 and 408 in spur measurement system 400. The multiple spur cancellation circuits can operate independently, while having only one PLL. In FIG. 4, the spur cancellation circuits 407 and 408 receive different spur frequencies (FCW1 and FCW2) to cancel. Thus, more than one spur can be targeted and measured at a time thereby allowing a list of possible spur frequencies to be processed faster with less hardware. In embodiments, the multiple spur cancellation circuits may be time interleaved. While two spur cancellation circuits are shown, additional spur cancellation circuits may be used.

Figure 5:
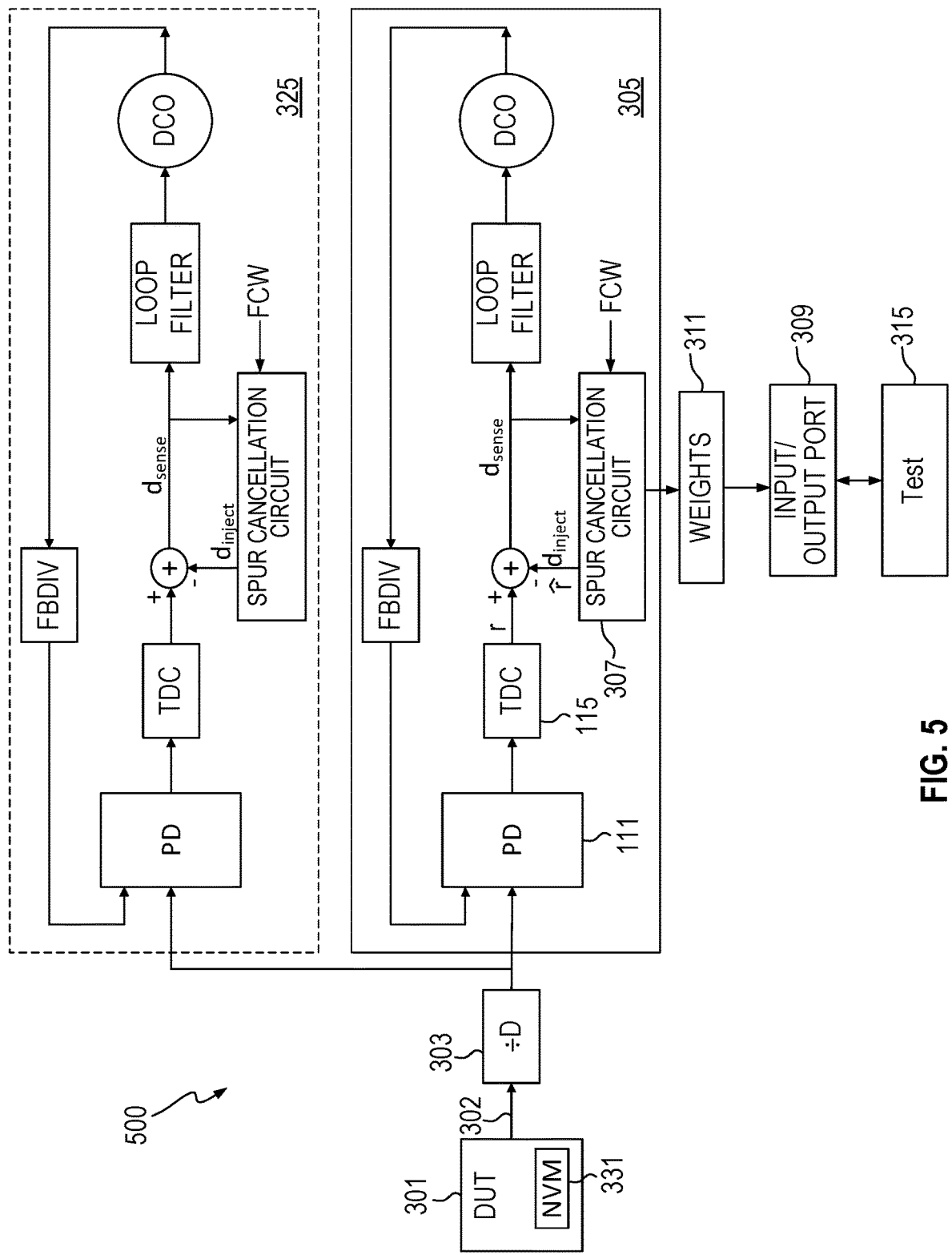
FIG. 5 illustrates an embodiment of a spur measurement system that uses multiple PLLs.

Referring to FIG. 5, embodiments may utilize multiple PLLs, e.g., PLLs 305 and 325 in a spur measurement system 500, each with one or more spur cancellation circuits. Note that the weights storage and I/O port associated with PLL 325 were omitted for ease of illustration.

Once the spurs of interest have been measured to determine if they exist in the output clock signal 302 of DUT 301, the presence or absence of a spur above a specified level acts as a test instrument readout. The presence or absence of a spur may be used, e.g., to screen or bin parts, or to aide in process control in manufacturing. In addition, embodiments may store results of the spur testing in the DUT itself in NVM 331. The information may include, e.g., the frequencies of the spurs tested and the results of the testing.

Figure 6:
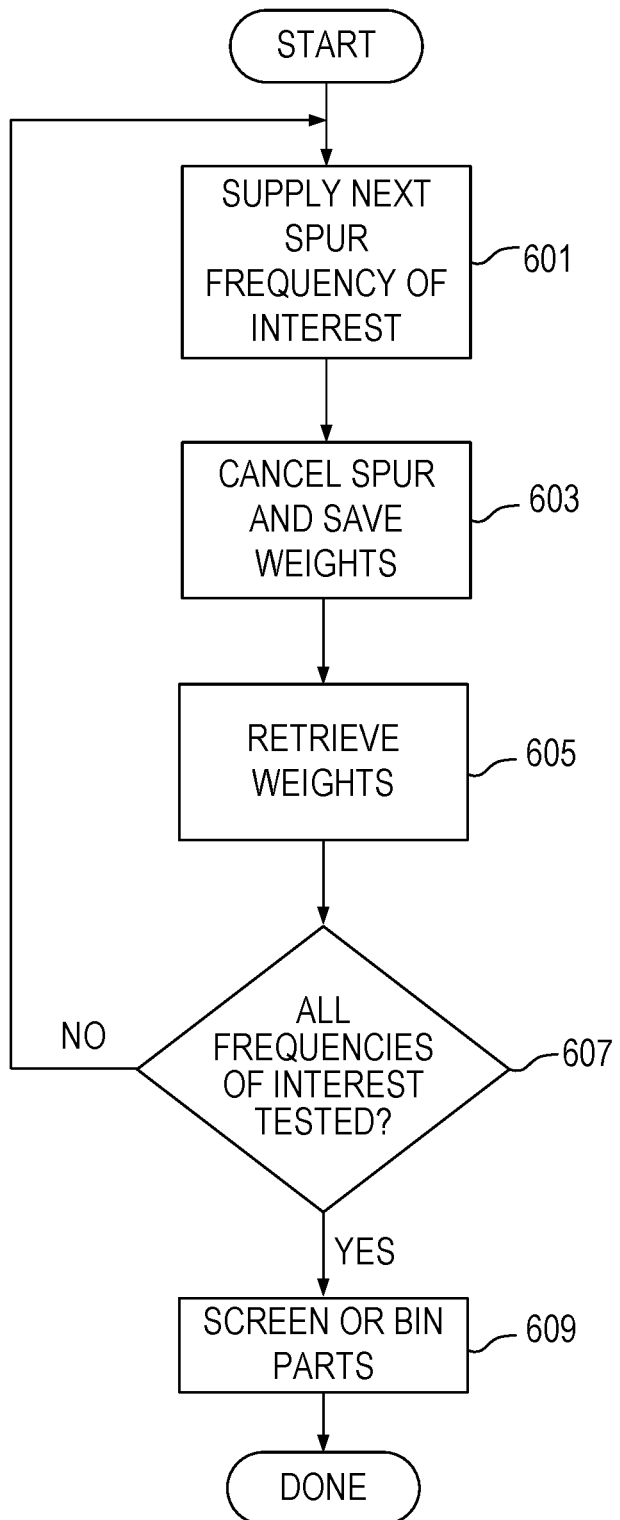
FIG. 6 illustrates an example flow diagram of operation of a spur measurement system.

FIG. 6 illustrates a flow chart illustrating an embodiment of operation of the spur measurement system 300, 400, or 500 illustrated in FIGS. 3, 4 and 5. In 601 the tester 315 supplies a spur frequency of interest (the FCW) through the I/O port 309. The DUT 301 supplies the output clock signal 302 through optional divider 303 to the PLL 305. In 603 the PLL 305 cancels any spurs present at the frequency of interest and stores the sine and cosine weights associated with the spur cancellation in weights storage 311. Note that storing the weights may simply be part of the process of the cancellation and not a separate action on the part of the spur cancellation circuit. At 605 the test apparatus 315 retrieves the weights and determines the magnitude of the spur at the frequency of interest as described above. If all the frequencies of interest have not been tested in 607, the test apparatus returns to 601 and supplies a next spur frequency of interest. If all the frequencies of interest have been tested, in 609 the spur test results can be used to screen or bin parts. Note that many variations of the flow diagram of FIG. 6 are possible. For example, the tester may supply multiple FCWs at one time and the PLL 305 cycles through the various FCWs. The PLL 305 may store all the weights for all the tests in memory 311 and the tester only retrieves the weights and makes magnitude calculations at the end of the testing. The tester may test the DUT using multiple PLLs or multiple spur cancellation circuits with one PLL for greater efficiency.

Thus, various aspects have been described relating to spur measurement. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:
1. A method comprising:
supplying a first device that includes a phase-locked loop having a spur cancellation circuit with a frequency control word identifying a first frequency corresponding to a spurious tone of interest to be measured in a first signal supplied by a device under test;
generating a second signal in the phase-locked loop of the first device based on the first signal and a feedback signal;
determining a presence of the spurious tone in the second signal using the spur cancellation circuit in the first device, determination of the presence of the spurious tone based on a sine weight and a cosine weight used to generate a spur cancellation signal, the sine weight and the cosine weight set at respective values to cancel the spurious tone;
determining a first magnitude of the spurious tone in the second signal based on the sine weight and the cosine weight of the spur cancellation signal;
dividing the first magnitude of the spurious tone in the second signal by a plurality of gain factors of the phase-locked loop to determine a second magnitude of the spurious tone in the first signal.
2. The method, as recited in claim 1, further comprising:
generating the second signal in a time-to digital converter in the phase-locked loop; and
controlling an oscillator of the phase-locked loop based on the second signal.

3. The method, as recited in claim 1, further comprising:
dividing the first signal in a divider circuit and supplying a divided first signal to the first device.

4. The method, as recited in claim 1,
wherein the plurality of gain factors of the phase-locked loop include a first gain of a phase detector in the phase-locked loop and include a second gain of a time to digital converter in the phase-locked loop.

5. The method, as recited in claim 1, further comprising:
using multiple spur cancellation circuits, including the spur cancellation circuit, to measure spurs at multiple frequencies in the first signal.

6. The method, as recited in claim 1, further comprising:
supplying the spur cancellation circuit with additional frequency control words identifying additional frequencies corresponding to spurious tones of interest to be measured in the first signal.

7. The method, as recited in claim 1, further comprising:
using multiple phase-locked loops, including the phase-locked loop, each of the multiple phase-locked loops with one or more spur cancellation circuits, to detect spurious tones of interest in the first signal.

8. The method as recited in claim 1 further comprising:
supplying from a test device spur frequency control words identifying spur frequencies to evaluate, the spur frequency control words including the frequency control word identifying the first frequency; and
receiving the spur frequency control words at an input/output port of the first device.

9. A spur measurement system comprising:
a first device including a phase-locked loop with a spur cancellation circuit responsive to a frequency control word identifying a spurious tone of interest to test for in a first signal received by the first device;
the spur cancellation circuit being configured to cancel the spurious tone of interest in a second signal generated by the phase-locked loop, the second signal based on the first signal and a feedback signal;
a storage circuit in the first device storing information used by the spur cancellation circuit to cancel the spurious tone of interest;
wherein a first magnitude of the spurious tone in the second signal is determined based on a cosine weight and a sine weight used to generate a cancellation signal to cancel the spurious tone;
a phase detector;
a time to digital converter;
wherein a second magnitude of the spurious tone in the first signal is determined by the first magnitude divided by one or more gain factors of the phase-locked loop; and
wherein the one or more gain factors of the phase-locked loop include a first gain of the phase detector and a second gain of the time to digital converter.

10. The spur measurement system, as recited in claim 9, further comprising:
a divider to divide the first signal and supply a divided signal from a device under test as the first signal to the first device.

11. The spur measurement system, as recited in claim 9, further comprising:
a plurality of spur cancellation circuits, including the spur cancellation circuit, to determine presence of a plurality of spurious tones in the first signal, the plurality of spur cancellation circuits configured in the phase-locked loop in the first device.

12. The spur measurement system, as recited in claim 9, further comprising:
a plurality of phase-locked loops, including the phase-locked loop, with respective spur cancellation circuits, to detect spurious tones of interest in the first signal.

13. A method comprising:
supplying a spur cancellation circuit of a phase-locked loop in a first device with a frequency control word identifying a frequency corresponding to a spurious tone of interest to be measured in a first signal;
generating the first signal in a device under test;
generating a second signal in the phase-locked loop of the first device, the second signal based in part on the first signal;
determining presence of the spurious tone in the first signal based on generation of a spur cancellation signal in the spur cancellation circuit to cancel the spurious tone;
generating a sine weight and a cosine weight in the spur cancellation circuit to generate the spur cancellation signal used to cancel the spurious tone;
determining a first magnitude of the spurious tone in the second signal using the sine weight and the cosine weight; and
determining a second magnitude of the spurious tone in the first signal based on the first magnitude divided by a plurality of gain factors of the phase-locked loop.

14. The method, as recited in claim 13, wherein the plurality of gain factors of the phase-locked loop include a first gain of a phase detector in the phase-locked loop and include a second gain of a time to digital converter in the phase-locked loop.

15. The method, as recited in claim 13, further comprising:
dividing the first signal in a divider circuit and supplying a divided first signal for measurement of the spurious tone.

16. The method as recited in claim 13 further comprising:
storing in the device under test, information including frequencies of spurs tested and results of testing of the spurs.

* * * * *